US009040961B2

(12) United States Patent
Kim

(10) Patent No.: US 9,040,961 B2
(45) Date of Patent: May 26, 2015

(54) ORGANIC LIGHT EMITTING DIODE DISPLAY AND METHOD FOR MANUFACTURING THE SAME

(75) Inventor: Tae-Jin Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 8 days.

(21) Appl. No.: 13/342,816

(22) Filed: Jan. 3, 2012

(65) Prior Publication Data

US 2012/0319141 A1    Dec. 20, 2012

(30) Foreign Application Priority Data

Jun. 14, 2011 (KR) .......................... 10-2011-0057674

(51) Int. Cl.
  *H01L 51/56* (2006.01)
  *H01L 51/52* (2006.01)
  *H01L 27/32* (2006.01)

(52) U.S. Cl.
  CPC ........ *H01L 51/5246* (2013.01); *H01L 51/5256* (2013.01); *H01L 27/3246* (2013.01); *H01L 51/525* (2013.01)

(58) Field of Classification Search
  None
  See application file for complete search history.

(56) References Cited

U.S. PATENT DOCUMENTS

| | | | | |
|---|---|---|---|---|
| 6,911,667 | B2 * | 6/2005 | Pichler et al. | 257/40 |
| 7,030,558 | B2 * | 4/2006 | Park et al. | 313/512 |
| 7,602,118 | B2 * | 10/2009 | Cok et al. | 313/506 |
| 7,902,567 | B2 * | 3/2011 | Oh et al. | 257/100 |
| 2003/0104753 | A1 * | 6/2003 | Graff et al. | 445/24 |
| 2003/0207500 | A1 * | 11/2003 | Pichler et al. | 438/127 |
| 2006/0186802 | A1 * | 8/2006 | Cok et al. | 313/506 |
| 2007/0152212 | A1 * | 7/2007 | Cho et al. | 257/40 |
| 2007/0181872 | A1 * | 8/2007 | Lee et al. | 257/40 |
| 2009/0079328 | A1 * | 3/2009 | Fedorovskaya et al. | 313/504 |
| 2009/0278454 | A1 | 11/2009 | Fedorovskaya et al. | |
| 2010/0171416 | A1 * | 7/2010 | Lee | 313/504 |
| 2011/0018008 | A1 * | 1/2011 | Lee | 257/88 |
| 2011/0140163 | A1 * | 6/2011 | Oh et al. | 257/100 |
| 2012/0091477 | A1 * | 4/2012 | Kim | 257/88 |

FOREIGN PATENT DOCUMENTS

| | | |
|---|---|---|
| JP | 2003-264062 | 9/2003 |
| JP | 2010-027624 | 2/2010 |
| KR | 10-2004-0035929 A | 4/2004 |
| KR | 10-2004-0039608 A | 5/2004 |
| KR | 10-0796129 B1 | 1/2008 |

\* cited by examiner

*Primary Examiner* — Matthew W Such
*Assistant Examiner* — Abul Kalam
(74) *Attorney, Agent, or Firm* — Christie, Parker & Hale, LLP

(57) ABSTRACT

An organic light emitting diode (OLED) display includes a substrate main body, a plurality of organic light emitting elements on the substrate main body, a column spacer on the substrate main body and between two or more of the plurality of organic light emitting elements, and an encapsulation thin film covering at least one of the organic light emitting elements and having regions divided by the column spacer.

13 Claims, 5 Drawing Sheets

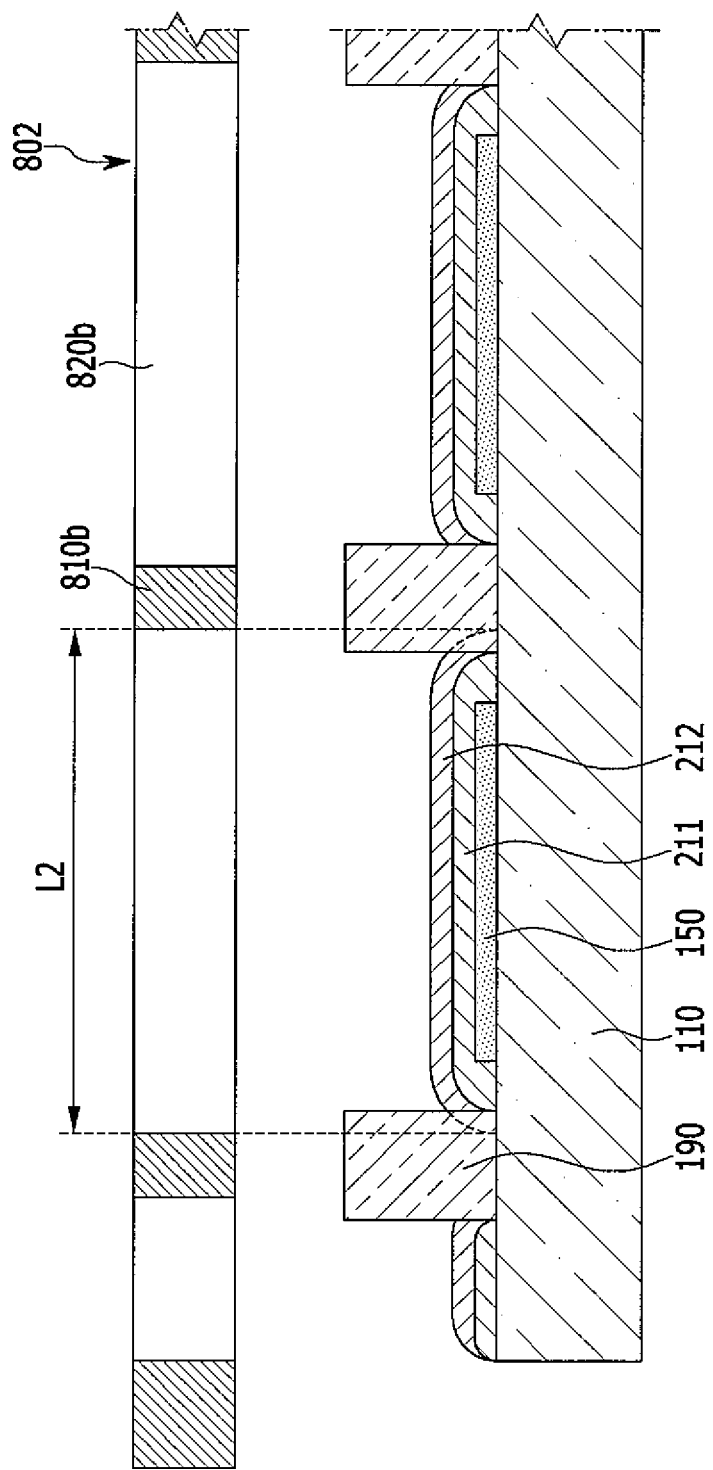

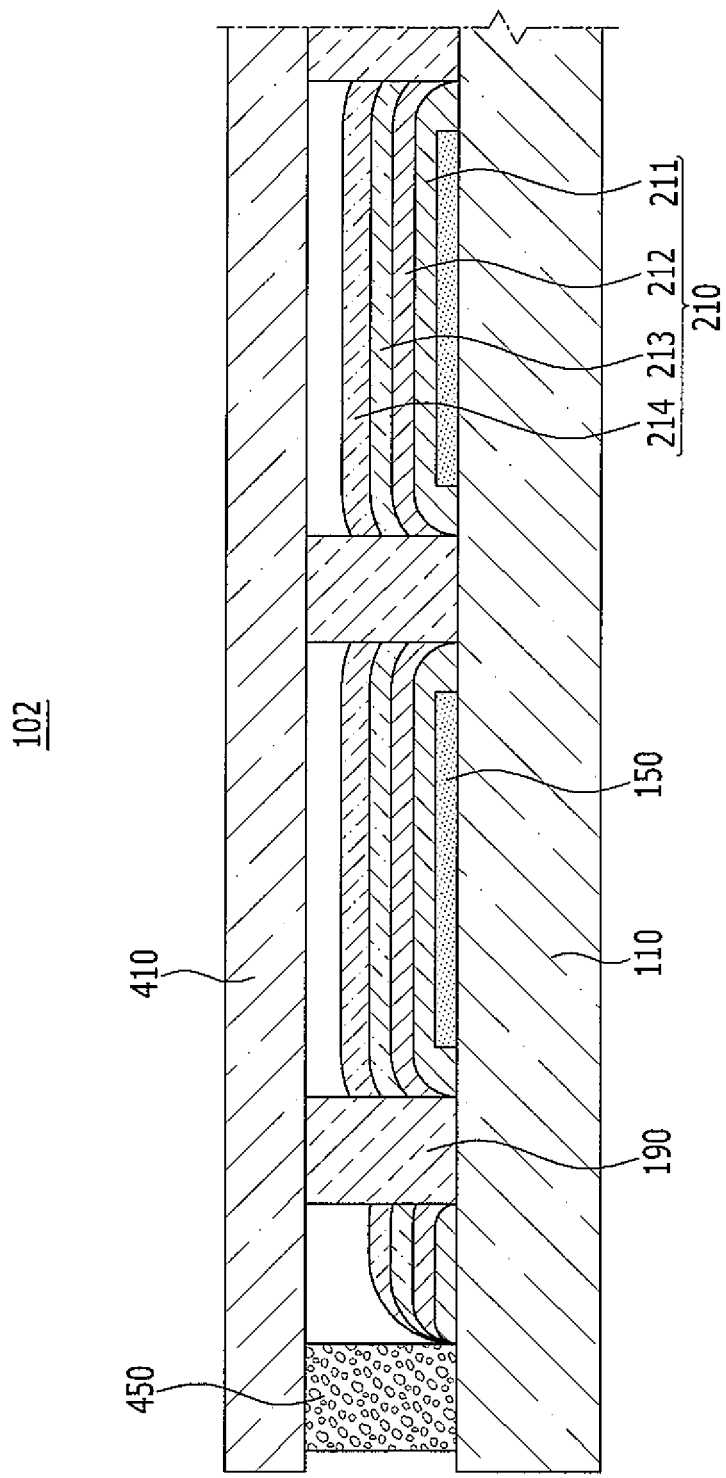

ORGANIC LIGHT EMITTING DIODE DISPLAY AND METHOD FOR MANUFACTURING THE SAME

CROSS-REFERENCE TO RELATED APPLICATION

This application claims priority to and the benefit of Korean Patent Application No. 10-2011-0057674 filed in the Korean Intellectual Property Office on Jun. 14, 2011, the entire contents of which are incorporated herein by reference.

BACKGROUND

1. Field

Embodiments of the present invention relate generally to an organic light emitting diode (OLED) display, and a manufacturing method thereof.

2. Description of Related Art

An organic light emitting diode (OLED) display has a self-emissive characteristic, and thus, unlike a liquid crystal display, does not require a separate light source, such as a backlight. Therefore, the OLED display can be reduced in thickness and weight. In addition, since the OLED display has high quality characteristics such as low power consumption, high luminance, fast reaction time, and the like, the OLED display is drawing attention as a next generation display device for a portable electronic device.

The OLED display includes a plurality of organic light emitting elements (organic light emitting diodes) having a hole injection electrode, an organic emission layer, and an electron injection electrode. Light is emitted due to energy that is generated when excitons, which are generated by coupling electrons and holes within the organic emission layer, drop from an excited state to a ground state, whereby the OLED display displays an image.

However, the organic emission layer sensitively reacts to external factors, such as moisture and oxygen. Accordingly, if the organic emission layer is exposed to moisture or oxygen, the quality of the OLED display is deteriorated. Therefore, to protect the organic light emitting elements and to reduce or prevent the moisture or oxygen from penetrating into the organic emission layer, an encapsulation substrate is sealed and combined with the substrate formed with the organic light emitting element through a sealing process, or a thin film encapsulation layer is formed on the organic light emitting element.

Particularly, if the thin film encapsulation layer is used, the overall thickness of the OLED display may be reduced when compared with an OLED display using the encapsulation substrate. Also, the thin film encapsulation layer may enable a more flexible display.

However, the OLED display using the thin film encapsulation is relatively weak with regard to external impact, and defects due to scratches may be easily generated.

The above information disclosed in this Background section is only for enhancement of understanding of the background of the described technology and therefore it may contain information that does not form the prior art that is already known in this country to a person of ordinary skill in the art.

SUMMARY

An exemplary embodiment of the present invention provides an OLED display improving mechanical integrity and scratch resistance while using an encapsulation thin film, and a manufacturing method thereof.

An OLED display according to an exemplary embodiment includes a substrate main body, a plurality of organic light emitting elements on the substrate main body, a column spacer on the substrate main body and between two or more of the plurality of organic light emitting elements, and an encapsulation thin film covering at least one of the organic light emitting elements and having regions divided by the column spacer.

The column spacer may have a height that is greater than a thickness of the encapsulation thin film.

The encapsulation thin film may include a plurality of layers.

The encapsulation thin film may include at least one of organic thin films and at least one of inorganic thin films that are alternately deposited.

The organic thin film may include a polymer-based material, and the inorganic thin film may include at least one of $Al_2O_3$, $TiO_2$, $ZrO$, $SiO_2$, $AlON$, $AlN$, $SiON$, $Si_3N_4$, $ZnO$, or $Ta_2O_5$.

The organic light emitting diode (OLED) display may further include an encapsulation substrate opposite to the substrate main body with one of the organic light emitting elements and the encapsulation thin film interposed therebetween, and a sealant between the substrate main body and an edge of the encapsulation substrate, the sealant bonding and sealing the substrate main body and the encapsulation substrate.

The column spacer may separate and support the substrate main body and the encapsulation substrate.

A method of manufacturing an organic light emitting diode (OLED) display according to another exemplary embodiment includes providing a substrate main body, forming a plurality of organic light emitting elements on the substrate main body, forming a column spacer on the substrate main body between two or more of the organic light emitting elements, and forming an encapsulation thin film covering at least one of the organic light emitting elements and having regions divided by the column spacer.

The column spacer may have a height that is greater than a thickness of the encapsulation thin film.

The encapsulation thin film may include a plurality of layers.

The method may further include alternately depositing the layers of the encapsulation thin film, the layers including at least one of organic thin films and at least one of inorganic thin films.

The organic thin film may include a polymer-based material, and the inorganic thin film may include at least one of $Al_2O_3$, $TiO_2$, $ZrO$, $SiO_2$, $AlON$, $AlN$, $SiON$, $Si_3N_4$, $ZnO$, or $Ta_2O_5$.

The method may further include depositing the encapsulation thin film on the substrate main body using a deposition mask comprising a shield part corresponding to the column spacer and an opening part corresponding to the at least one of the organic light emitting elements and a circumference thereof, and gradually widening the opening part of the deposition mask from depositing a lowest layer to depositing a highest layer of the encapsulation thin film.

The method may further include forming a sealant on or near an edge of the substrate main body, arranging an encapsulation substrate opposite to the substrate main body with at least one of the organic light emitting elements and the encapsulation thin film interposed therebetween, and hardening the sealant to bond and seal the substrate main body and the encapsulation substrate.

The column spacer may separate and support the substrate main body and the encapsulation substrate.

According to exemplary embodiments, the organic light emitting device may have improved mechanical integrity and scratch resistance.

Also, the OLED display may be effectively manufactured.

BRIEF DESCRIPTION OF THE DRAWINGS

FIG. 2 to FIG. 4 are cross-sectional views sequentially showing a manufacturing process of the OLED display of the embodiment shown in FIG. 1.

FIG. 5 is a cross-sectional view of an OLED display according to another exemplary embodiment of the present invention.

DETAILED DESCRIPTION

Figure 1:
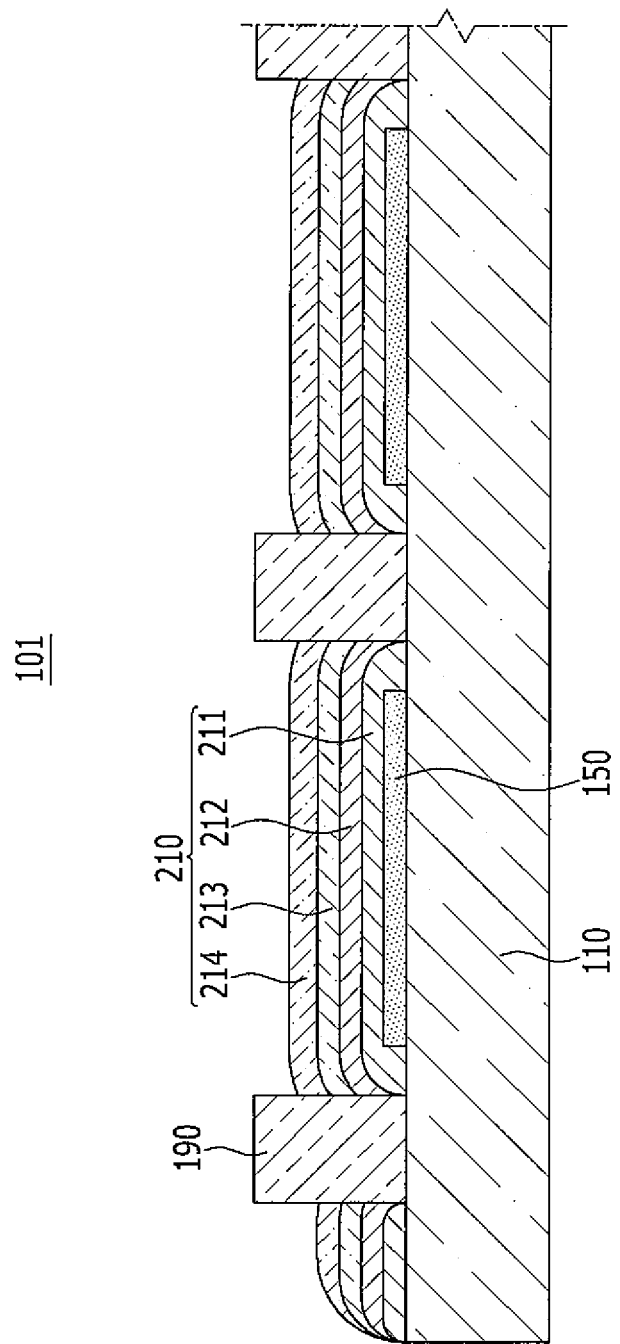
FIG. 1 is a cross-sectional view of an OLED display according to an exemplary embodiment of the present invention.

Embodiments of the present invention will be described more fully hereinafter with reference to the accompanying drawings, in which exemplary embodiments of the invention are shown. As those skilled in the art will realize, the described embodiments may be modified in various different ways, all without departing from the spirit or scope of the present invention.

In the various exemplary embodiments, same reference numerals are used for elements having the same configuration, and will be representatively described in a first exemplary embodiment, while in other exemplary embodiments, only elements different from those of the first exemplary embodiment will be described.

The drawings are schematic and not necessarily proportionally scaled.

Relative scales and ratios in the drawings may be enlarged or reduced for the purpose of convenience of description, and the scales shown in the drawings may be random, and embodiments of the present invention are therefore not limited thereto. In addition, like reference numerals designate like structures, elements, or parts throughout the specification. It will be understood that when an element, such as a layer, film, region, or substrate, is referred to as being "on" another element, it may be directly on the other element or intervening elements may also be present.

Embodiments of the invention are described through schematic illustrations of exemplary embodiments of the invention. As such, embodiments of the invention may vary from the shapes of the illustrations. Thus, embodiments of the invention should not be construed to be limited to the particular shapes of regions illustrated herein, but are to include deviations in shapes that result, for example, from manufacturing.

Hereafter, referring to FIG. 1, an organic light emitting diode (OLED) display 101 according to the first exemplary embodiment will be described.

As shown in FIG. 1, the OLED display 101 according to a first exemplary embodiment includes a substrate main body 110, a plurality of organic light emitting elements 150, an encapsulation thin film 210, and a column spacer 190.

The substrate main body 110 may be made of various materials, such as glass, quartz, and ceramic.

The organic light emitting elements 150 are formed on the substrate main body 110. The organic light emitting elements 150 emit light such that the OLED display 101 displays images.

The organic light emitting elements 150 emit light according to a driving signal(s) of a driving circuit. Although not shown, the driving circuit is formed with circuit elements including a plurality of thin film transistors and capacitors.

The organic light emitting elements 150 and the driving circuit may be formed with various structures, as will be known to one of ordinary skill in the art.

The column spacer 190 is formed on the substrate main body 110, and is located between a plurality of organic light emitting elements 150.

The encapsulation thin film 210 covers and protects the organic light emitting elements 150. The encapsulation thin film 210 of the present embodiment may be formed with a plurality of layers. In detail, the encapsulation thin film 210 may have a structure in which at least one of organic thin films 211 and 213 and at least one of inorganic thin films 212 and 214 are alternatively deposited. According to the present embodiment as shown in FIG. 1, a lowest layer 211 is formed with the organic thin film and a highest layer 214 is formed with the inorganic thin film.

When at least one of organic thin films 211 and 213 and at least one of inorganic thin films 212 and 214 are alternatively deposited to form the encapsulation thin film 210, respective merits and drawbacks of the organic thin films 211 and 213 and the inorganic thin films 212 and 214 may be compensated. For example, the inorganic thin films 212 and 214 have a relative ability to transmit vapor, which may suppress performance when compared to the organic thin films 211 and 213, while the organic thin films 211 and 213 have a relatively better smoothing characteristic and more effectively reduce interlayer stress compared to the inorganic thin films 212 and 214.

The organic thin films 211 and 213 may be made of a polymer-based material. In the present embodiment, the polymer-based material includes at least one of an acryl-based resin, an epoxy-based resin, a polyimide, or polyethylene.

The inorganic thin films 212 and 214 may be formed with a material including at least one of $Al_2O_3$, $TiO_2$, $ZrO$, $SiO_2$, AlON, AlN, SiON, $Si_3N_4$, ZnO, or $Ta_2O_5$.

Also, a portion of the region of the encapsulation thin film 210 is divided by the column spacer 190 (e.g., portions of the encapsulation thin film 210 corresponding to adjacent organic light emitting elements 150 are divided by the column spacer 190). That is, the encapsulation thin film 210 covers the organic light emitting element 150, but does not cover the column spacer 190.

Also, the encapsulation thin film 210 is lower than the column spacer 190. That is, the column spacer 190 is relatively higher than the encapsulation thin film 210 to protect the encapsulation thin film 210 from an impact applied from the outside and to suppress generation of scratches to the encapsulation thin film 210.

By this configuration, the OLED display 101 according to the first exemplary embodiment may have mechanical integrity and scratch resistance that is improved by the column spacer 190, while also having a reduced or minimized overall thickness by using the encapsulation thin film 210.

Next, referring to FIG. 2 to FIG. 4, a manufacturing method of the OLED display 101 according to the first exemplary embodiment will be described.

Figure 2:
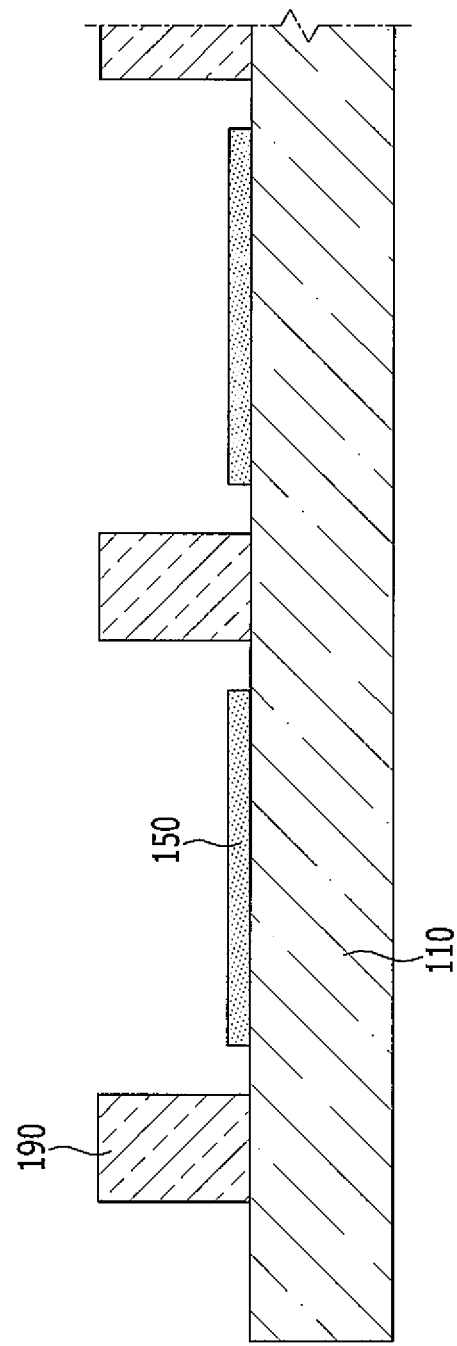

Firstly, as shown in FIG. 2, a substrate main body 110 is made of a material such as glass, quartz, or ceramic. Next, a plurality of organic light emitting elements 150 are formed on the substrate main body 110.

Next, a column spacer 190 is formed between two or more of the organic light emitting elements 150. The column spacer 190 may be formed by patterning a photosensitive organic material, for example, by a photo process.

Figure 3:
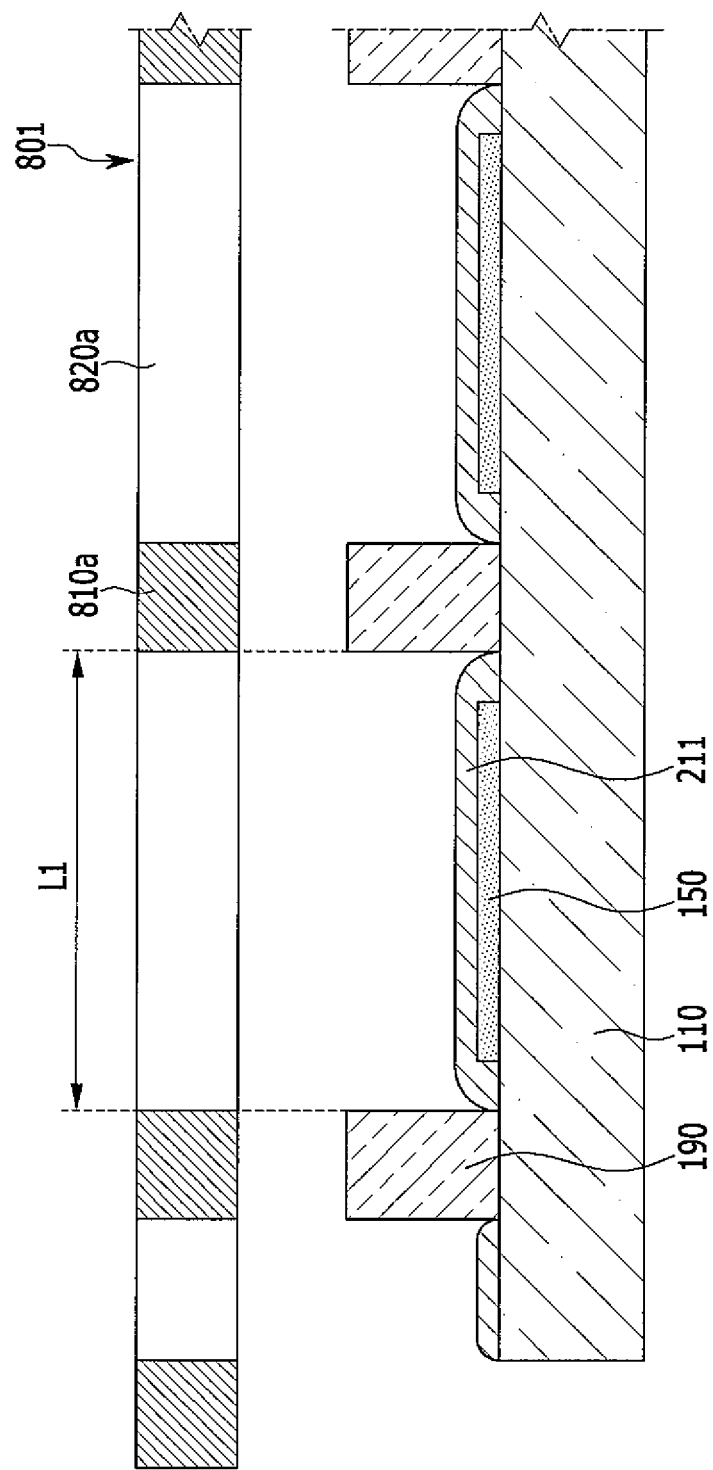

Next, as shown in FIG. 3, a lowest layer 211 of the encapsulation thin film 210 covering the organic light emitting element 150 is formed on the substrate main body 110 by using a first deposition mask 801 including a shield part 810a and an opening part 820a.

As shown in FIG. 1, the encapsulation thin film 210 includes a plurality of organic thin films 211 and 213 and a plurality of inorganic thin films 212 and 214 alternatively arranged. Here, the lowest layer 211 of the encapsulation thin film 210 may be formed with the organic thin film. However, the first exemplary embodiment is not limited thereto. Accordingly, the lowest layer 211 of the encapsulation thin film 210 may be formed with the inorganic thin film, and the encapsulation thin film 210 may even be formed with only the inorganic thin film.

The shield part 810a of the deposition mask 801 is located corresponding to the column spacer 190, and the opening part 820a is located corresponding to the organic light emitting element 150 and the circumference thereof.

As shown in FIG. 3, the opening of the deposition mask 801 used when depositing the lowest layer 211 of the encapsulation thin film 210 may have a same area L1 as an area between column spacers 190. That is, the opening part 820a of the deposition mask 801 is formed to have the same pattern as the portion of the entire area of the substrate main body 110 that is not occupied with the column spacers 190.

Next, as shown in FIG. 4, a second layer 212 of the encapsulation thin film 210 is deposited. The opening part 820b of a second deposition mask 802 used when depositing the second layer 212 has a wider area than the opening part 820a of the deposition mask 801 used when depositing the lowest layer 211. That is, the opening part 820b of the deposition mask 802 used to deposit the second layer 212 is formed with an area L2 that is larger than the area between the column spacers 190 (e.g., L1 of FIG. 3). Accordingly, shield part 810b of FIG. 4 is smaller than shield part 810a of FIG. 3.

As described above, the opening part 820 of the deposition masks 801 and 802, as well as subsequent deposition masks, which are used for deposition, are gradually widened from the lowest layer 211 to the highest layer 214 of the encapsulation thin film 210.

If all layers of the encapsulation thin film 210 were to be formed by using the deposition mask 801 having the same opening 820a, the shape of a portion where the encapsulation thin film 210 and the column spacer 190 contact each other would be such that ends of the several layers of the encapsulation thin film 210 formed on the end of the substrate main body 110 are concentrated into one point. If this shape is formed, the area where the encapsulation thin film 210 and the column spacer 190 contact each other is decreased such that it is relatively easy for the moisture and oxygen to penetrate into the interface between the encapsulation thin film 210 and the column spacers 190.

However, according to the manufacturing method of the OLED display 101 according to exemplary embodiments of the present invention, the area of the opening part 820a of the deposition mask 801 is controlled according to the layer of the encapsulation thin film 210 such that the area where the encapsulation thin film 210 and the column spacer 190 contact may be increased. Accordingly, the moisture and oxygen penetrating into the interface between the column spacer 190 and the encapsulation thin film 210 may be further suppressed.

Also, the entire thickness of the encapsulation thin film 210 is less than the height of the column spacers 190. Accordingly, the encapsulation thin film 210 may be protected from scratches by the column spacers 190. Also, the OLED display 101 according to exemplary embodiments of the present invention may compensate for deteriorated mechanical integrity through the column spacers 190 by using the encapsulation thin film 210.

According to a manufacturing method of embodiment of the present invention, the OLED display 101 having improved mechanical integrity and scratch resistance by the column spacer 190 may be manufactured by using the encapsulation thin film 210 while reducing or minimizing the thickness.

Next, a second exemplary embodiment will be described with reference to FIG. 5.

As shown in FIG. 5, an organic light emitting diode (OLED) display 102 according to the second exemplary embodiment further includes an encapsulation substrate 410 arranged opposite to the substrate main body 110 via the organic light emitting element 150 and the encapsulation thin film 210 interposed therebetween, and a sealant 450 located between the substrate main body 110 and the edge of the encapsulation substrate 410, the sealant 450 bonding and sealing the substrate main body 110 and the encapsulation substrate 410. Here, the column spacer 190 separates, and acts as a support between, the substrate main body 110 and the encapsulation substrate 410.

By this configuration, the encapsulation thin film 210 may be further stably and solidly protected from external impact or damage.

Also, the encapsulation thin film 210 is formed inside a space sealed by the sealant 450 and the encapsulation member 410, such that the sealant 450 may be sufficiently formed with an epoxy-based material with a relatively low cost. That is, compared to a sealant made of a frit material, although the sealant 450 made of the epoxy-based material has somewhat low vapor transmission resistance, the organic light emitting element 150 is nonetheless protected with the thin film encapsulation layer 210, so the frit material, which is relatively expensive, does not need to be used for the sealant 450. Further, by using the sealant 450 made of the epoxy-based material, the drawback of easy breaking caused by an external impact when the sealant made of frit is used can be avoided.

The manufacturing method of the OLED display 102 according to the second exemplary embodiment further includes forming the sealant 450 at or near (e.g., adjacent) the edge of the substrate main body 110, and arranging the encapsulation substrate 410 to be opposite to the substrate main body 110 via the organic light emitting element 150 and the encapsulation thin film 210, and hardening the sealant 450 to seal and bond the substrate main body 110 and the encapsulation substrate 410 to each other, as well as the manufacturing method according to the first exemplary embodiment.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and their equivalents.

---

Description of Some of the Reference Numerals

101: organic light emitting diode (OLED) display
110: substrate main body
150: organic light emitting element

| Description of Some of the Reference Numerals |
| --- |
| 190: column spacer |
| 210: encapsulation thin film |

What is claimed is:

1. An organic light emitting diode (OLED) display comprising:
   a substrate main body;
   a plurality of organic light emitting elements on the substrate main body;
   a column spacer on the substrate main body, spaced apart from and between two or more of the plurality of organic light emitting elements; and
   an encapsulation thin film comprising a plurality of layers, a bottom layer of which covering and contacting at least one of the organic light emitting elements and contacting the substrate main body, the encapsulation thin film having regions divided by the column spacer, the column spacer being between and separating portions of the encapsulation thin film,
   wherein the bottom layer of the encapsulation thin film is formed by being deposited through an opening part of a first deposition mask that is narrower than an opening part of a second deposition mask wherein a higher layer of the encapsulation thin film is deposited through the opening part of the second deposition mask such that a contact area between the higher layer of the encapsulation thin film and the column spacer is greater than a contact area between the bottom layer and the column spacer.

2. The organic light emitting diode (OLED) display of claim 1, wherein the column spacer has a height that is greater than a thickness of the encapsulation thin film.

3. The organic light emitting diode (OLED) display of claim 1, wherein the encapsulation thin film comprises at least one of organic thin films and at least one of inorganic thin films that are alternately deposited.

4. The organic light emitting diode (OLED) display of claim 3,
   wherein the organic thin film comprises a polymer-based material, and
   wherein the inorganic thin film comprises at least one of $Al_2O_3$, $TiO_2$, $ZrO$, $SiO_2$, AlON, AlN, SiON, $Si_3N_4$, ZnO, or $Ta_2O_5$.

5. The organic light emitting diode (OLED) display of claim 1, further comprising:
   an encapsulation substrate opposite to the substrate main body with one of the organic light emitting elements and the encapsulation thin film interposed therebetween; and
   a sealant between the substrate main body and an edge of the encapsulation substrate, the sealant bonding and sealing the substrate main body and the encapsulation substrate.

6. The organic light emitting diode (OLED) display of claim 5, wherein the column spacer separates and supports the substrate main body and the encapsulation substrate.

7. A method of manufacturing an organic light emitting diode (OLED) display, the method comprising:
   providing a substrate main body;
   forming a plurality of organic light emitting elements on the substrate main body;
   forming a column spacer on the substrate main body spaced apart from and between two or more of the organic light emitting elements; and
   forming an encapsulation thin film covering at least one of the organic light emitting elements and having regions divided by the column spacer, the column spacer being between and separating portions of the encapsulation thin film,
   wherein forming the encapsulation thin film comprises depositing a lower layer of the encapsulation thin film through an opening part of a first deposition mask, and depositing a higher layer of the encapsulation thin film through an opening part of a second deposition mask, wherein the opening part of the second deposition mask is wider than the opening part of the first deposition mask such that a contact area between the higher layer of the encapsulation thin film and the column spacer is greater than a contact area between the lower layer and the column spacer.

8. The method of claim 7, wherein the column spacer has a height that is greater than a thickness of the encapsulation thin film.

9. The method of claim 7, further comprising alternately depositing the layers of the encapsulation thin film, the layers comprising at least one of organic thin films and at least one of inorganic thin films.

10. The method of claim 9,
    wherein the organic thin film comprises a polymer-based material, and
    wherein the inorganic thin film comprises at least one of $Al_2O_3$, $TiO_2$, $ZrO$, $SiO_2$, AlON, AlN, SiON, $Si_3N_4$, ZnO, or $Ta_2O_5$.

11. The method of claim 7, further comprising:
    forming a sealant on or near an edge of the substrate main body;
    arranging an encapsulation substrate opposite to the substrate main body with at least one of the organic light emitting elements and the encapsulation thin film interposed therebetween; and
    hardening the sealant to bond and seal the substrate main body and the encapsulation substrate.

12. The method of claim 11, wherein
    the column spacer separates and supports the substrate main body and the encapsulation substrate.

13. A method of manufacturing an organic light emitting diode (OLED) display, the method comprising:
    providing a substrate main body;
    forming a plurality of organic light emitting elements on the substrate main body;
    forming a column spacer on the substrate main body between two or more of the organic light emitting elements;
    forming an encapsulation thin film covering at least one of the organic light emitting elements and having regions divided by the column spacer, wherein the encapsulation thin film comprises a plurality of layers;
    depositing the encapsulation thin film on the substrate main body using a deposition mask comprising a shield part corresponding to the column spacer and an opening part corresponding to the at least one of the organic light emitting elements and a circumference thereof; and
    gradually widening the opening part of the deposition mask from depositing a lowest layer to depositing a highest layer of the encapsulation thin film.

* * * * *